United States Patent
Chen

(10) Patent No.: US 10,802,632 B2
(45) Date of Patent: Oct. 13, 2020

(54) DISPLAY PANEL AND DISPLAY DEVICE

(71) Applicant: Wuhan China Star Optoelectronics Semiconductor Display Technology Co., Ltd., Wuhan (CN)

(72) Inventor: Caiqin Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/317,597

(22) PCT Filed: Sep. 7, 2018

(86) PCT No.: PCT/CN2018/104610
§ 371 (c)(1),
(2) Date: Jan. 14, 2019

(87) PCT Pub. No.: WO2020/037723
PCT Pub. Date: Feb. 27, 2020

(65) Prior Publication Data
US 2020/0125201 A1    Apr. 23, 2020

(30) Foreign Application Priority Data

Aug. 21, 2018    (CN) .......................... 2018 1 0951556

(51) Int. Cl.
*G06F 3/041*    (2006.01)
*H01L 27/12*    (2006.01)
*H01L 29/786*    (2006.01)
*G02F 1/1333*    (2006.01)

(52) U.S. Cl.
CPC ........ *G06F 3/0412* (2013.01); *H01L 27/1222* (2013.01); *H01L 29/78621* (2013.01); *H01L 29/78633* (2013.01); *H01L 29/78675* (2013.01); *G02F 1/13338* (2013.01)

(58) Field of Classification Search
CPC .............. G06F 3/0412; H01L 27/1222; H01L 29/78621; H01L 29/78633; H01L 29/78675; G02F 1/13338
See application file for complete search history.

(56) References Cited

U.S. PATENT DOCUMENTS

| | | | |
|---|---|---|---|
| 9,977,274 B2 * | 5/2018 | Shin | .......................... G06F 3/041 |
| 2013/0162570 A1 * | 6/2013 | Shin | .......................... G06F 3/041 345/173 |
| 2018/0341356 A1 * | 11/2018 | Wu | .................... G02F 1/133711 |

* cited by examiner

*Primary Examiner* — Afroza Chowdhury

(57) ABSTRACT

A display panel and a display device are provided for which the first touch electrode wires and pixel electrodes are formed by the same mask process. Furthermore, the first touch electrode wires are disposed on the same layer as the second common electrode. Thus, the number of masks is reduced while the duration and the cost of the manufacturing process are reduced.

17 Claims, 4 Drawing Sheets

DISPLAY PANEL AND DISPLAY DEVICE

RELATED APPLICATIONS

This application is a National Phase of PCT Patent Application No. PCT/CN2018/104610 having International filing date of Sep. 7, 2018, which claims the benefit of priority of Chinese Patent Application No. 201810951556.7 filed on Aug. 21, 2018. The contents of the above applications are all incorporated by reference as if fully set forth herein in their entirety.

FIELD AND BACKGROUND OF THE INVENTION

The present disclosure relates to the field of display technology, and particularly to a display panel and a display device.

Touch-control technology the key feature of intelligent device and is applied in various areas. After a rapid development, touch-control technology includes difference touch sensing theorem such as resistive touch, optical touch, capacitive touch, etc. After developing for several generations, the capacitive touch is the most widely used touch technology.

In low temperature poly-silicon (LTPS) products, capacitive touch divides into out cell, on cell, and in cell. In comparison with non-ITP, in cell touch panel (ITP) only requires a two-layer structure, including touch sensing electrodes and a touch insulation layer. However, the technology of LTPS is complex. Manufacturing of films of the array substrate therefor normally requires more than ten layers, and accordingly a large number of mask processes. Longer the time for manufacturing products is required, so that the cost of light irradiation and manufacturing also increase.

As a result, based on this technical problem, the present disclosure provides a new structure as a solution.

SUMMARY OF THE INVENTION

The present disclosure provides a display panel and display device to solve the problem resulted from complex technic of array substrate.

To solve the about-mentioned problems, the present disclosure provides the following solution.

The present disclosure provides a display panel includes an array substrate. The array substrate includes:
a substrate;
a first common electrode disposed above the substrate;
a second common electrode disposed above the first common electrode;
a first touch electrode wire disposed on a same layer as the second common electrode, and coupled to a part of the first common electrode through a first via hole;
a second touch electrode wire disposed on the first touch electrode wire, and coupled to the part of the first common electrode through the first touch electrode wire.

In the display panel of the present disclosure, the first touch electrode wire and the second common electrode are formed on a same metal layer by a same mask process.

In the display panel of the present disclosure, the array substrate further comprises a third via hole, a part of the second common electrode couples to a source/drain electrode of the array substrate through the third via hole.

In the display panel of the present disclosure, an orthographic projection of the second touch electrode wire on the first touch electrode wire is located within an area of the first touch electrode wire.

In the display panel of the present disclosure, the second touch electrode wire and the first electrode wire are formed in a same mask process.

In the display panel of the present disclosure, the array substrate further comprises a second via hole disposed in a non-display area of the display panel, another first touch electrode wire disposed in the non-display area is coupled to a source/drain electrode in the non-display area through the second via hole.

The present disclosure further provides a display panel comprising an array substrate, the array substrate compassing:
a substrate;
a first common electrode disposed above the substrate;
a second common electrode disposed above the first common electrode; and
a first touch electrode wire disposed on a same layer as the second common electrode, and coupled to a part of the first common electrode through a first via hole;

In the display panel of the present disclosure, the first touch electrode wire and the second common electrode are formed on a same metal layer by a same mask process.

In the display panel of the present disclosure, the array substrate further comprises a third via hole, a part of the second common electrode couples to a drain electrode of the array substrate through the third via hole.

In the display panel of the present disclosure, the array substrate further comprises a second touch electrode wire disposed on the first touch electrode wire, and coupled to the part of the first common electrode through the first touch electrode wire.

In the display panel of the present disclosure, an orthographic projection of the second touch electrode wire on the first touch electrode wire is located within an area of the first touch electrode wire.

In the display panel of the present disclosure, the second touch electrode wire and the first electrode wire are formed in a same mask process.

In the display panel of the present disclosure, the array substrate further comprises a second via hole disposed in a non-display area of the display panel, another first touch electrode wire disposed in the non-display area is coupled to a source/drain electrode in the non-display area through the second via hole.

The present disclosure further provides a display device comprising a display panel. The display panel comprising:
a substrate;
a first common electrode disposed above the substrate;
a second common electrode disposed above the first common electrode; and
a first touch electrode wire disposed on a same layer as the second common electrode, and coupled to apart of the first common electrode through a first via hole;

In the display device of the present disclosure, the first touch electrode wire and the second common electrode are formed on a same metal layer by a same mask process.

In the display device of the present disclosure, the array substrate further comprises a second via hole, a part of the second common electrode couples to a drain electrode of the array substrate through the second via hole.

In the display device of the present disclosure, the array substrate further comprises a second touch electrode wire disposed on the first touch electrode wire, and coupled to the part of the first common electrode through the first touch electrode wire.

In the display device of the present disclosure, an orthographic projection of the second touch electrode wire on the first touch electrode wire is located within an area of the first touch electrode wire.

In the display device of the present disclosure, the second touch electrode wire and the first electrode wire are formed in a same mask process.

In the display device of the present disclosure, the array substrate further comprises a second via hole disposed in a non-display area of the display panel, another first touch electrode wire disposed in the non-display area is coupled to a source/drain electrode in the non-display area through the second via hole.

Beneficial effect: the present forms the first touch electrode wires and pixel electrodes in the same mask process. Furthermore, the first touch electrode wires are disposed on the same layer as the second common electrode. Thus, the number of masks is reduced while the duration and the cost of the manufacture process are reduced.

BRIEF DESCRIPTION OF THE SEVERAL VIEWS OF THE DRAWINGS

To clarify the technology method of the embodiments of the present disclosure, the following context will introduce the drawings representing the embodiments of the present disclosure. Obviously, the described drawings are only a part but not all of the drawings for exemplifying the present invention instead of limiting the present invention. For a skilled person in the art, other drawings may be obtained by referencing the drawings of the present disclosure without creative efforts.

DESCRIPTION OF SPECIFIC EMBODIMENTS OF THE INVENTION

The illustrations of the following embodiments take the attached drawings as reference to indicate the applicable specific examples of the present disclosure. The mentioned directional terms, such as upper, lower, front, back, left, right, inner, outer, side, etc., are only directions by referring to the accompanying drawings, and thus the used directional terms are used to describe and understand the present invention, but the present invention is not limited thereto. In drawings, similar structures will use a same reference number.

First Embodiment

Figure 1:
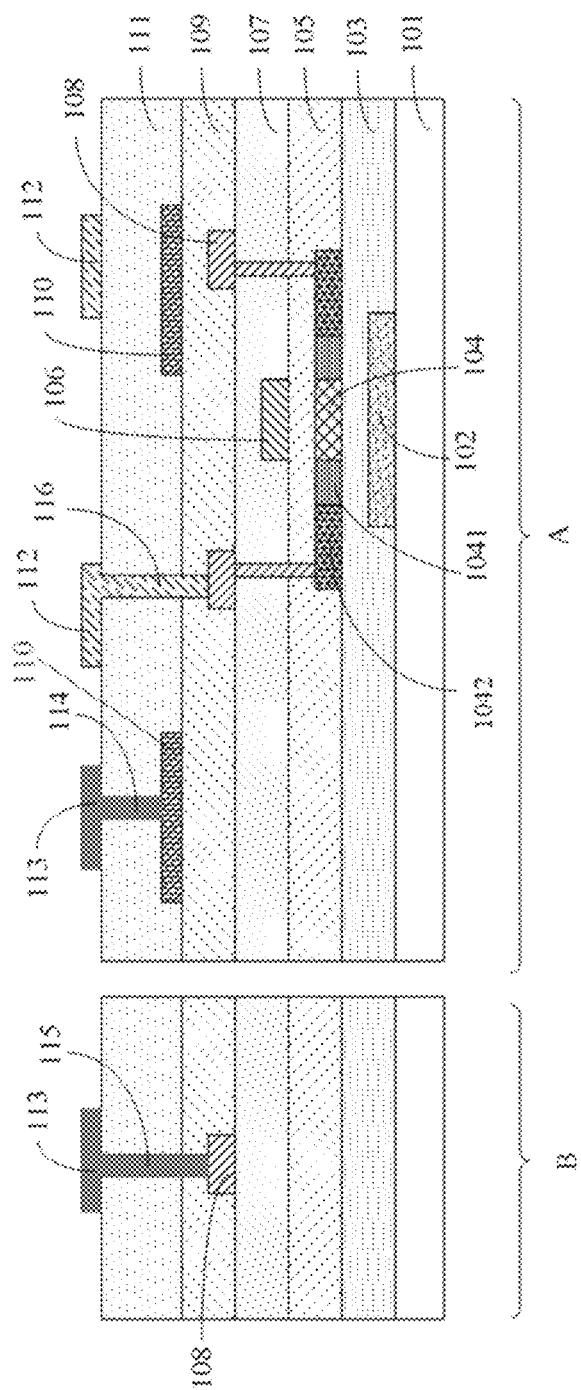
FIG. 1 illustrates a structure of layers of an array substrate in accordance with an embodiment of the present disclosure.

Please refer to FIG. 1 which illustrates a structure of layers of an array substrate in accordance with the first embodiment of the present disclosure. A display panel includes the array substrate. The array substrate includes a substrate 101, a transistor layer disposed on the substrate 101, a planarization layer 109 disposed on the transistor layer, a first common electrode 110 disposed on the planarization layer 109, a passivation layer 111 disposed on the first common electrode 110, and a second common electrode 112 and a plurality of first touch electrode wires disposed on the first passivation layer 111.

In the first embodiment, an area A is a display area, and an area B is a non-display area.

In the first embodiment, the transistor layer includes a light-block layer 102, a buffer layer 103, a silicon channel layer 104, a first insulation layer 104, a gate electrode 106, a second insulation layer 107, a source/drain electrode 108 and a plurality of via holes.

Material for forming the substrate 101 can be one glass, quartz, resin, etc.

The light-block layer 102 is disposed on the substrate 101. The light-block layer 102 can be composed, but not limited to black light-block material.

The buffer lay 103 is disposed and covers the light-block layer 102.

The silicon channel 104 is disposed on the buffer layer 103 and composed of polycrystalline silicon. The silicon channel 104 includes low-doped areas 1041 and high-doped areas 1042 which are doped with ions. The high-doped areas 1042 are disposed on both sides of the silicon channel 104. The low-doped areas 1041 are disposed between the silicon channel which is not doped with any ion and the high-doped areas 1042. The high-doped areas 1042 are injected with high-concentration N+ ions. The low-doped areas 1041 are injected with low-concentration N− ions.

The first insulation layer 105 is disposed on the silicon layer 104. The first insulation layer 105 functions as a gate insulation layer. The gate insulation layer covers the silicon layer 104. The main object of the gate insulation layer is insulating the silicon channel layer 104 from other metal layers.

In the first embodiment, the gate insulation layer can be composed of silicon nitride, oxide-silicon, silicon-oxy-nitride, etc.

The gate electrode 106 is disposed on the first insulation layer 105. The gate electrode is made of metal such as molybdenum, aluminum, nickel-aluminum alloy, molybdenum-tungsten alloy, chromium, copper, etc., or any combination of the above-mentioned metal materials.

In the first embodiment, the gate electrode 106 is made of molybdenum.

A first mask process is applied on a metal layer for forming the gate electrode 106 which includes forming a light-block layer on the metal layer, light exposure through the mask (not shown in drawings), development and etching the metal layer, thereby forming a pattern. The gate electrode 106 as shown in FIG. 1 is thus formed. The light-block layer is finally stripped away.

The second insulation layer 107 is disposed in the gate electrode 106 as an interval insulation layer. The interval insulation layer convers the gate electrode 106. The main object of the interval insulation layer insulates the gate electrode from source/drain electrodes 108.

The source/drain electrodes 108 are disposed on the second insulation layer 107. The source/drain electrodes 108 are made of metal such as molybdenum, alumni, nickel-aluminum alloy, molybdenum-tungsten alloy, chromium, copper, titanium aluminum alloy, etc., or any combination of above-mentioned metal materials. In the first embodiment, the metal material to form the source/drain electrodes can be titanium-aluminum alloy.

A second mask process is applied on a metal layer for forming the source/drain electrodes 108, which includes forming a light-block layer, light exposure through the mask (not shown in drawings), development, etching the metal layer, thereby forming a pattern. The source/drain electrodes 108 as shown in FIG. 1 are thus formed. The light-block layer is finally stripped away.

The planarization layer 109 is disposed on the source/drain electrodes 108. The planarization layer 109 in utilized to cover the source/drain electrodes 108 and guarantee a planarity of the layer structure.

The first common electrode 110 is disposed on the planarization layer 109.

Figure 2:
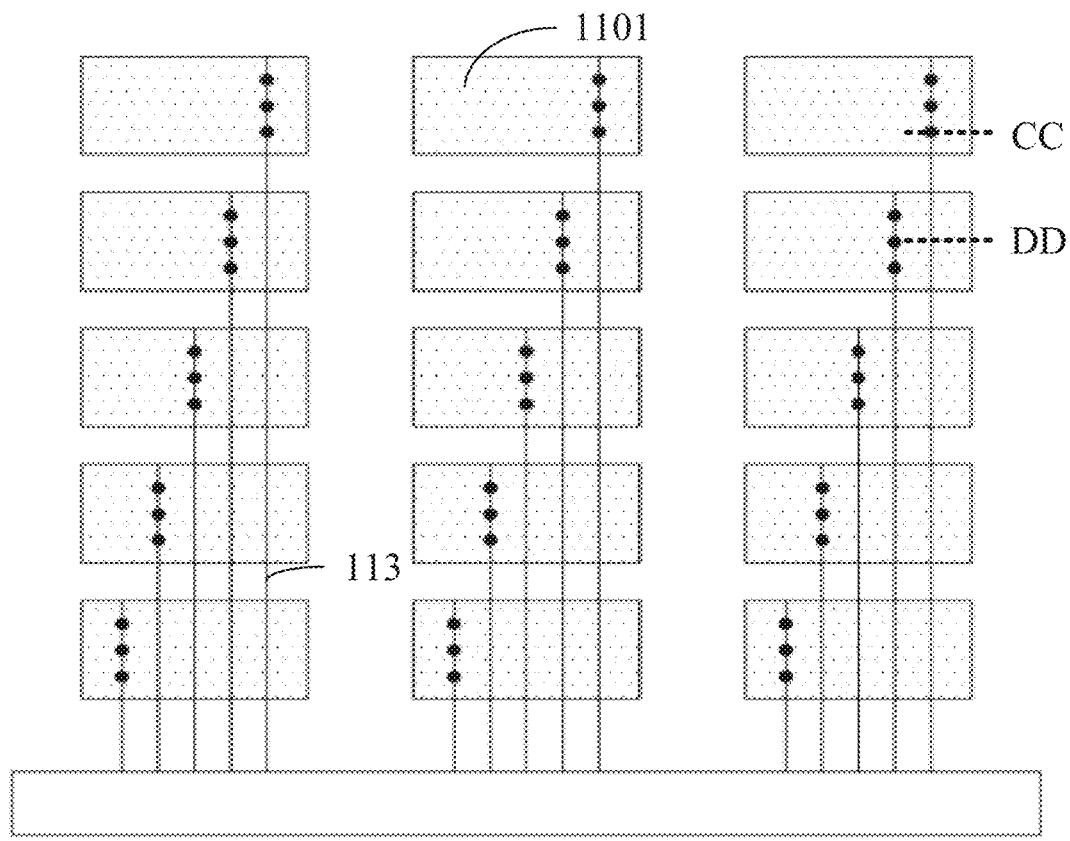
FIG. 2 illustrates a top view of a touch sensing layer of the array substrate in accordance with the embodiment of the present disclosure.

Please refer to FIG. 2 which is a top view of a touch sensing layer of an array substrate of the embodiment of the present disclosure.

The first common electrode 110 includes a plurality of common electrode boards 1101 which is arranged in an array. Each of the common electrode boards 1101 corresponds to at least one first touch electrode wire 113. The common electrode boards 1101 of the first common electrode 110 and a pixel electrode layer are configured to drive liquid crystals when the display panel is in display mode.

The passivation layer 111 is disposed on the first common electrode 110 and utilized to guarantee a planarity of the layer structure. In one of the embodiments, the material to from the passivation layer 111 can be a composition of silicon nitride.

The second common electrode 112 is disposed on the passivation layer 111. The second common electrode 112 is also called pixel electrode. The first common electrode 110 and the second common electrode 112 provide the voltages required for rotating the liquid crystal molecules.

In one of the embodiments, the array substrate includes first touch electrode wires 113. The first touch electrode wires 113 are disposed on the passivation layer 111 and at the same layer as the second common electrode 112.

In one of the embodiments, the first touch electrode wires 113 and the second common electrode 112 are disposed on the same layer and formed by the same mask process. The first touch electrode wires each are connected to a part of the first common electrode 110 through a via hole 114.

Please refer to FIG. 1, the array substrate further includes a third via hole 116. A part of the second common electrode 112 is connected to a source/drain electrode through the third via hole 116. The first via hole 114 penetrates through a part of the passivation layer 111. The third via hole 116 penetrates through the passivation layer 111 and a part of the planarization layer 109.

Figure 3:
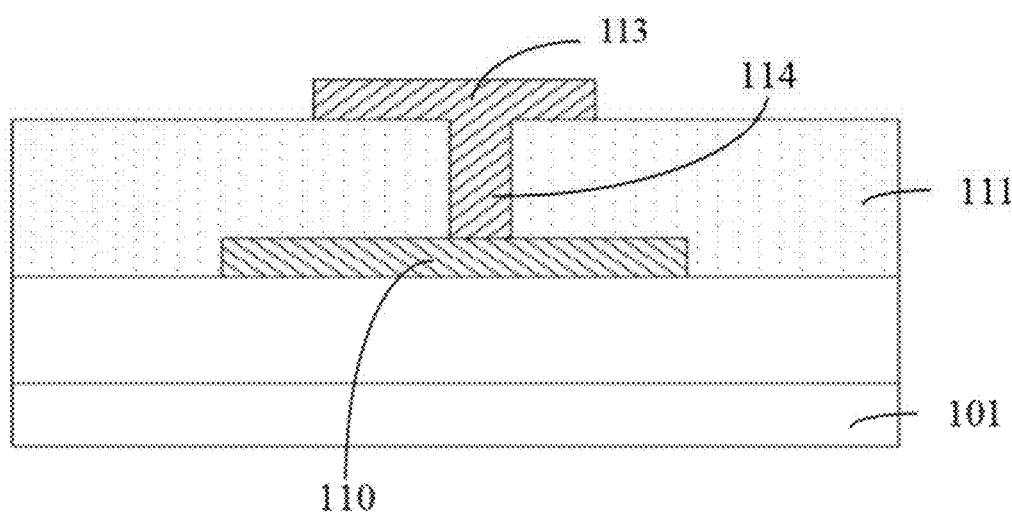
FIG. 3 illustrates a cross-sectional view of a layered structure of the first embodiment, obtained from the line C-C of FIG. 2.

Please refer to FIG. 3 which is a cross-sectional view of a layered structure taken from line C-C of FIG. 2. The first touch electrode wire 113 is coupled to the first common electrode 110 through the first via hole 114.

Figure 4:
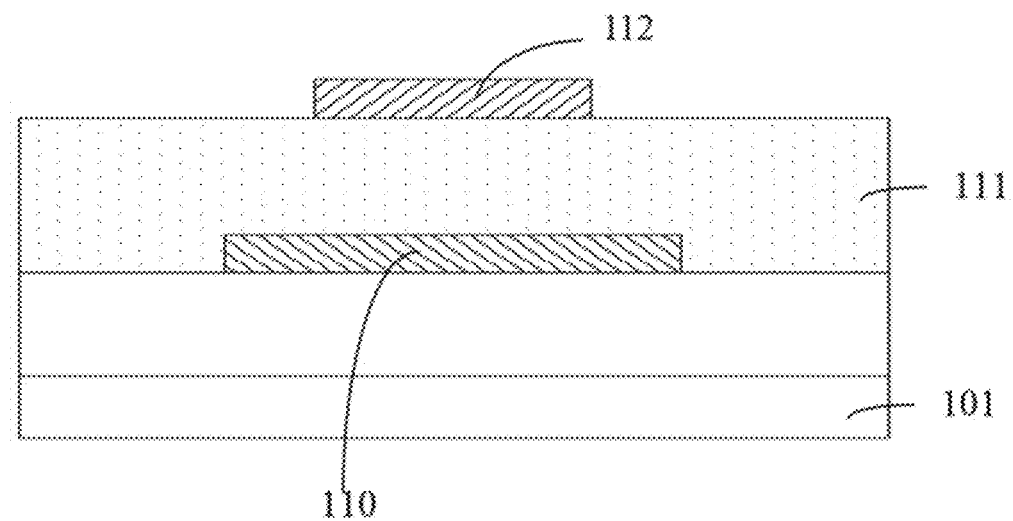
FIG. 4 illustrates a cross-sectional view of a layered structure of a second embodiment, obtained from the line D-D of FIG. 2.

Please refer to FIG. 4 which is a cross-sectional view of a layered structure taken from line D-D of FIG. 2. The second common electrode 112 is formed on the passivation layer 111 and parallel to the first common electrode 110.

Please refer to FIG. 1. The array substrate further includes a second via hole 115 disposed in the non-display area B of the display panel. The first touch electrode wire disposed in the non-display area B is connected to the source/drain electrode 108 disposed in the non-display area B through the second via hole 115.

The first touch electrode wires 113 and pixel electrodes can be formed by the same metal layer. In comparison with the present technology, two mask processes are saved for forming the first touch electrode 113 and the insulation layer between the first touch electrode 113 and the second common electrode 112. The duration of the manufacture is reduced and the cost of manufacturing decreases.

Second Embodiment

Figure 5:
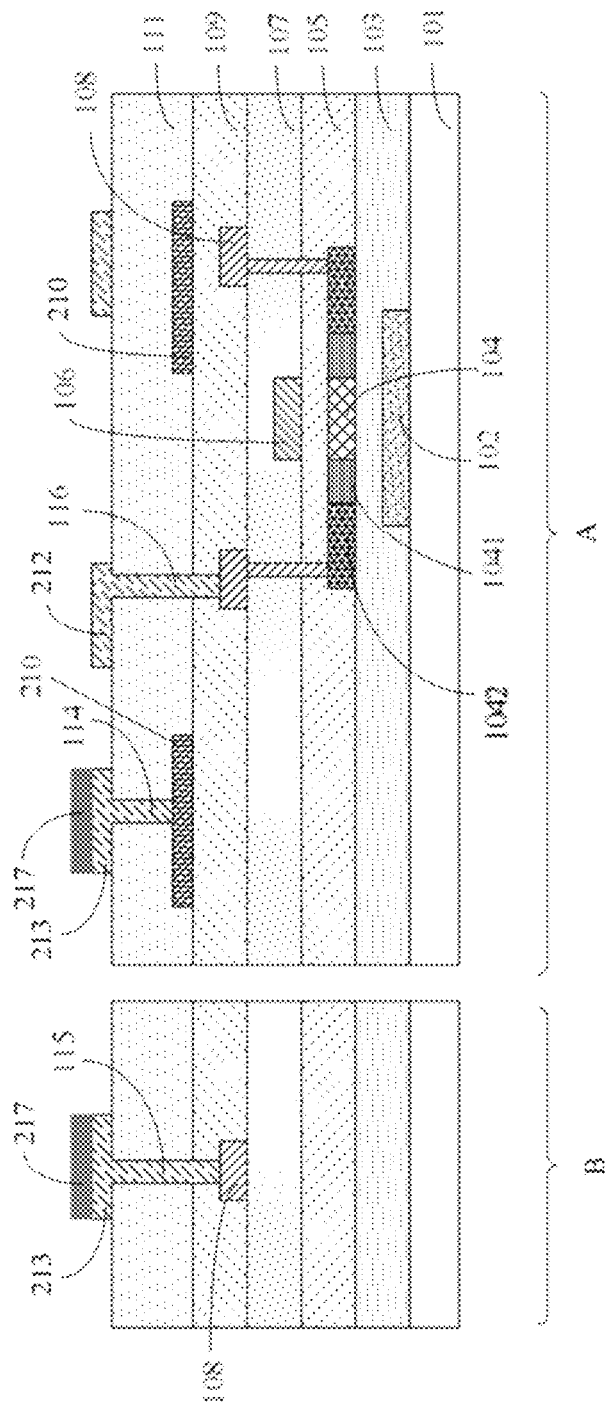
FIG. 5 illustrates a layered structure of an array substrate of the second embodiment of the present disclosure.

Please refer to FIG. 5 which illustrate the layered structure of an array substrate of the second embodiment.

The array substrate further includes a plurality of second touch electrode wires 217 disposed on first touch electrode wires 213. The second touch electrode wires 217 couple to first common electrode 210 through the first touch electrode wires 213.

In the embodiment, the first touch electrode wires 213 and the second touch electrode wires 217 are formed by the same mask process. Because the first touch electrode wires 213 and the second common electrode 212 are formed by the same mask process, the first touch electrode wires 213, the second touch electrode wires 217, and the second common electrode 212 are all formed by the same mask process.

In the embodiment, orthographic projections of the second touch electrode wires 217 on the first touch electrode wires 213 are located within areas of the first touch electrode wires 213.

This embodiment reduces resistance of touch electrode wires by disposed parallel second touch electrode wires 217 on the first touch electrode wires 213. Thus the sensitivity of touch sensing can be enhanced.

The present disclosure further provides a display device includes the above-mentioned display panel.

The present disclosure provides a display panel and a display device which form the first touch electrode wires and pixel electrodes by the same mask process. Furthermore, the first touch electrode wires are disposed on the same layer as the second common electrode. Thus, the number of masks is reduced while the duration and the cost of the manufacturing process are reduced.

To concludes, embodiments disclosed above are preferable embodiments rather than limitation of the present disclosure. Any changes and modifications can be completed by a skilled person in the art on the basis of the concept and the scope of the present disclosure. Therefore, the protected scope should base on the scope defined by claims in the present disclosure.

What is claimed is:

1. A display panel comprising an array substrate, wherein the array substrate comprises:
    a substrate;
    a first common electrode disposed above the substrate;
    a second common electrode disposed above the first common electrode;
    a first touch electrode wire disposed on a same layer as the second common electrode, and coupled to a part of the first common electrode through a first via hole;
    a second touch electrode wire disposed on the first touch electrode wire, and coupled to the part of the first common electrode through the first touch electrode wire; and
    a second via hole disposed in a non-display area of the display panel, wherein another first touch electrode wire disposed in the non-display area is coupled to a source/drain electrode in the non-display area through the second via hole.

2. The display panel according to claim 1, wherein the first touch electrode wire and the second common electrode are formed on a same metal layer by a same mask process.

3. The display panel according to claim 1, wherein the array substrate further comprises a third via hole, a part of the second common electrode couples to a source/drain electrode of the array substrate through the third via hole.

4. The display panel according to claim 1, wherein an orthographic projection of the second touch electrode wire on the first touch electrode wire is located within an area of the first touch electrode wire.

5. The display panel according to claim 4, wherein the second touch electrode wire and the first electrode wire are formed in a same mask process.

6. A display panel comprising an array substrate, wherein the array substrate comprises:
- a substrate;
- a first common electrode disposed above the substrate;
- a second common electrode disposed above the first common electrode; and
- a first touch electrode wire disposed on a same layer as the second common electrode, and coupled to a part of the first common electrode through a first via hole; and
- a second via hole disposed in a non-display area of the display panel, wherein another first touch electrode wire disposed in the non-display area is coupled to a source/drain electrode in the non-display area through the second via hole.

7. The display panel according to claim 6, wherein the first touch electrode wire and the second common electrode are formed on a same metal layer by a same mask process.

8. The display panel according to claim 6, wherein the array substrate further comprises a third via hole, a part of the second common electrode couples to a drain electrode of the array substrate through the third via hole.

9. The display panel according to claim 6, wherein the array substrate further comprises a second touch electrode wire disposed on the first touch electrode wire, and coupled to the part of the first common electrode through the first touch electrode wire.

10. The display panel according to claim 9, wherein an orthographic projection of the second touch electrode wire on the first touch electrode wire is located within an area of the first touch electrode wire.

11. The display panel according to claim 9, wherein the second touch electrode wire and the first electrode wire are formed in a same mask process.

12. A display device comprising a display panel, wherein the display panel comprises:
- a substrate;
- a first common electrode disposed above the substrate;
- a second common electrode disposed above the first common electrode; and
- a first touch electrode wire disposed on a same layer as the second common electrode, and coupled to apart of the first common electrode through a first via hole; and
- a second via hole disposed in a non-display area of the display panel, wherein another first touch electrode wire disposed in the non-display area is coupled to a source/drain electrode in the non-display area through the second via hole.

13. The display device according to claim 12, wherein the first touch electrode wire and the second common electrode are formed on a same metal layer by a same mask process.

14. The display device according to claim 12, wherein the array substrate further comprises a third via hole, a part of the second common electrode couples to a drain electrode of the array substrate through the third via hole.

15. The display device according to claim 12, wherein the array substrate further comprises a second touch electrode wire disposed on the first touch electrode wire, and coupled to the part of the first common electrode through the first touch electrode wire.

16. The display device according to claim 15, wherein an orthographic projection of the second touch electrode wire on the first touch electrode wire is located within an area of the first touch electrode wire.

17. The display device according to claim 15, wherein the second touch electrode wire and the first electrode wire are formed in a same mask process.

* * * * *